United States Patent
He et al.

(10) Patent No.: US 9,324,512 B2
(45) Date of Patent: Apr. 26, 2016

(54) SPST SWITCH, SPDT SWITCH, SPMT SWITCH AND COMMUNICATION DEVICE USING THE SAME

(71) Applicant: Nanyang Technological University, Singapore (SG)

(72) Inventors: Jin He, Singapore (SG); Yue Ping Zhang, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 14/360,785

(22) PCT Filed: Nov. 28, 2012

(86) PCT No.: PCT/SG2012/000448
§ 371 (c)(1),
(2) Date: May 27, 2014

(87) PCT Pub. No.: WO2013/081551
PCT Pub. Date: Jun. 6, 2013

(65) Prior Publication Data
US 2014/0327495 A1 Nov. 6, 2014

Related U.S. Application Data

(60) Provisional application No. 61/564,051, filed on Nov. 28, 2011.

(51) Int. Cl.
*H01P 1/15* (2006.01)
*H01H 9/54* (2006.01)
*H04B 1/44* (2006.01)
*H03K 17/693* (2006.01)
(Continued)

(52) U.S. Cl.
CPC .............. *H01H 9/54* (2013.01); *H03K 17/063* (2013.01); *H03K 17/693* (2013.01); *H04B 1/44* (2013.01); *H01L 27/0207* (2013.01)

(58) Field of Classification Search
CPC ................ H01P 1/10; H01P 1/15; H04B 1/44
USPC ....................... 333/101, 103; 455/78
See application file for complete search history.

(56) References Cited

U.S. PATENT DOCUMENTS 5,731,607 A * 3/1998 Kohama ................. 257/275
5,825,227 A * 10/1998 Kohama et al. ............ 327/308
(Continued)

OTHER PUBLICATIONS

Atesal et al., "Low-Loss 0.13-μm CMOS 50-70 GHz SPDT and SP4T Switches," *IEEE Radio Frequency Integrated Circuits Symposium*, RMO1B-4, pp. 43-46, 2009.
Chang et al., "A Low Loss High Isolation DC-60 GHz SPDT Traveling-Wave Switch With a Body Bias Technique in 90 nm CMOS Process," *IEEE Microwave and Wireless Components Letters* 20(2):82-84, 2010.
(Continued)

*Primary Examiner* — Dean Takaoka
(74) *Attorney, Agent, or Firm* — Seed IP Law Group PLLC

(57) ABSTRACT

Various embodiments provide a single pole single throw switch. The switch may include a first terminal, a second terminal and a control terminal; a field-effect transistor having a drain connected to the first terminal, a source connected to the ground, and a gate; a bias resistor connected between the gate of the field-effect transistor and the control terminal; an inductor connected between the first terminal and the second terminal; and a capacitor having one end connected to the second terminal and another end connected to the ground.

9 Claims, 15 Drawing Sheets

(51) Int. Cl.
  *H03K 17/06* (2006.01)
  *H01L 27/02* (2006.01)

(56) References Cited

U.S. PATENT DOCUMENTS

| | | | |
|---|---|---|---|
| 6,281,762 B1* | 8/2001 | Nakao et al. | 333/103 |
| 6,611,070 B2* | 8/2003 | Cayrou et al. | 307/130 |
| 6,693,498 B1* | 2/2004 | Sasabata et al. | 333/103 |
| 6,720,850 B2* | 4/2004 | Sasabata et al. | 333/261 |
| 6,804,502 B2* | 10/2004 | Burgener et al. | 455/333 |
| 7,098,755 B2 | 8/2006 | Zhao et al. | |
| 7,411,471 B2* | 8/2008 | Tsukahara | H01P 1/15 333/103 |
| 7,486,975 B2* | 2/2009 | Mori | 455/575.7 |
| 2002/0177417 A1 | 11/2002 | Visser | |

OTHER PUBLICATIONS

Chao et al., "A 50 to 94-GHz CMOS SPDT Switch Using Traveling-Wave Concept," *IEEE Microwave and Wireless Components Letters* 17(2):130-132, 2007.

Lai et al., "A 60-110 GHz Transmission-Line Integrated SPDT Switch in 90 nm CMOS Technology," *IEEE Microwave and Wireless Components Letters* 20(2):85-87, 2010.

Ta et al., "A 60-GHz CMOS Transmit/Receive Switch," *IEEE Radio Frequency Integrated Circuits Symposium*, pp. 725-728, 2007.

Tomkins et al., "A Passive W-Band Imaging Receiver in 65-nm Bulk CMOS," *IEEE Journal of Solid-State Circuits* 45(10):1981-1991, 2010.

Uzunkol et al., "A Low-Loss 50-70 GHz SPDT Switch in 90 nm CMOS," *IEEE Journal of Solid-State Circuits* 45(10):2003-2007, 2010.

* cited by examiner

Tx mode

(a)

Simplified Tx mode

(b)

Simplified Rx mode

Tx or Rx mode

US 9,324,512 B2

SPST SWITCH, SPDT SWITCH, SPMT SWITCH AND COMMUNICATION DEVICE USING THE SAME

CROSS-REFERENCE TO RELATED APPLICATIONS

The present application claims the benefit of the U.S. provisional patent application No. 61/564,051 filed on 28 Nov. 2011, the entire contents of which are incorporated herein by reference for all purposes.

TECHNICAL FIELD

Embodiments relate generally to a single pole single throw (SPST) switch, a single pole double throw (SPDT) switch, a single pole multiple throw (SPWT) switch, and a communication device using the same.

BACKGROUND

A number of circuit and architecture techniques in millimeter-wave (MMW) CMOS design and research have been developed, but many issues still remain. For instance, transmit/receive switches and high-efficiency power amplifiers are among critical issues that must be addressed. A transmit/receive switch is usually a SPDT switch, which is typically realized with two SPST switches plus an impedance matching network.

There have been various designs of transmit/receive switches in CMOS for MMW applications. Y. A. Atesal et al. ("Low-loss 0.13-um CMOS 50-70 GHz SPDT and SP4T switches," in *IEEE RFIC Symp. Dig.*, June 2009, pp. 43-46) describes a 50-70 GHz SPDT switch, as shown in FIG. 1. The SPDT switch 100 uses two symmetric SPST switches 110 based on the π-network. The input matching network is realized with quarter-wave length impedance transformers 120, which may consume a larger die area. This may result in a larger die size, e.g. a die size of 0.39×0.32 mm$^2$ in Y. A. Atesal et al.

SUMMARY

Various embodiments provide a single pole single throw switch. The switch may include a first terminal, a second terminal and a control terminal; a field-effect transistor having a drain connected to the first terminal, a source connected to the ground, and a gate; a bias resistor connected between the gate of the field-effect transistor and the control terminal; an inductor connected between the first terminal and the second terminal; and a capacitor having one end connected to the second terminal and another end connected to the ground.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which.

DESCRIPTION

Figure 1:
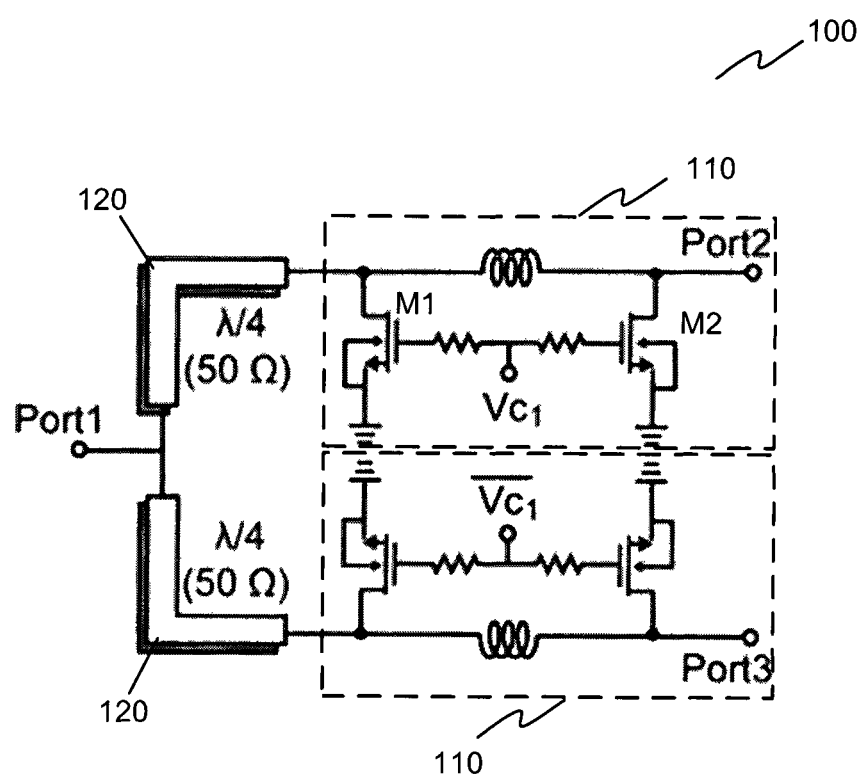
FIG. 1 shows a single pole single throw (SPDT) switch.

Various embodiments provide an asymmetric field effect transistor (FET) single-pole single-throw (SPST) cell, which may be used for design of single-pole double-throw (SPDT) switches and single-pole multiple-throw (SPMT) switches for millimeter-wave applications. The SPST switches according to various embodiments solves input impedance mismatch for design of SPDT and SPMT switches without the necessity of bulky quarter-wave length impedance transformers or other complex impedance matching network, leading to a small-size, low-cost and high-performance millimeter-wave switch solution.

One embodiment is directed to a single pole single throw switch. The switch may include a first terminal, a second terminal and a control terminal; a field-effect transistor having a drain connected to the first terminal, a source connected to the ground, and a gate; a bias resistor connected between the gate of the field-effect transistor and the control terminal; an inductor connected between the first terminal and the second terminal; and a capacitor having one end connected to the second terminal and another end connected to the ground.

In an embodiment, the single pole single throw switch may further include a protective resistor having one end connected to the gate of the field-effect transistor and another end connected to the ground. The protective resistor may provide protection in case of an electrostatic discharge (ESD) event.

In an illustrative embodiment, the protective resistor may have a resistance of about 100 kΩ. In other embodiments, the protective resistor may have a resistance of more than 100 kΩ, depending on the protection requirement of the single pole single throw switch.

According to an embodiment, the field-effect transistor may have a switched-on state exhibiting an on-resistance and a switched-off state exhibiting an off-capacitance. The switched-on state and the switched-off state of the field-effect transistor may be controlled by a control voltage applied to the control terminal.

Another embodiment is directed to a single pole double throw switch. The single pole double throw switch may include two single pole single throw switches as described above.

According to an embodiment, the single pole double throw switch may include a first terminal, a second terminal and a third terminal; a first control terminal and a second control terminal; a first field-effect transistor having a drain connected to the first terminal, a source connected to the ground, and a gate; a first bias resistor connected between the gate of the first field-effect transistor and the first control terminal; a first inductor connected between the first terminal and the second terminal; a second field-effect transistor having a drain connected to the third terminal, a source connected to the ground, and a gate; a second bias resistor connected between the gate of the second field-effect transistor and the second control terminal; a second inductor connected between the second terminal and the third terminal; and a capacitor having one end connected to the second terminal and another end connected to the ground.

In an embodiment, the single pole double throw switch may further include a first protective resistor having one end connected to the gate of the first field-effect transistor and another end connected to the ground; and a second protective resistor having one end connected to the gate of the second field-effect transistor and another end connected to the ground. The first and the second protective resistors may provide protection in case of an electrostatic discharge (ESD) event.

In an exemplary embodiment, the first and the second protective resistors may have a resistance of about 100 KΩ. In other embodiments, the first and the second protective resistors may have a resistance of more than 100 kΩ, depending on the protection requirement of the single pole double throw switch.

In one embodiment, the corresponding components of the two single pole single throw switches included in the single pole double throw switch may have the same parameters, so as to simplify the design of the single pole double throw switch. Illustratively, the inductance of the first inductor and of the second inductor in the SPDT switch may be the same; the on-resistance and the off-capacitance of the first field-effect transistor and of the second field-effect transistor in the SPDT switch may be the same; the resistance of the first bias resistor and of the second bias resistors in the SPDT switch may be the same; and the resistance of the first protective resistor and of the second protective resistor may be the same. In other embodiments, the corresponding components of the two single pole single throw switches may have different parameters, depending on the design requirement of the single pole double throw switch.

In an embodiment, each of the first and the second field-effect transistors may have a switched-on state exhibiting an on-resistance and a switched-off state exhibiting an off-capacitance. The switched-on state and the switched-off state of the first and the second field-effect transistors may be respectively controlled by a first control voltage applied to the first control terminal and a second control voltage applied to the second control terminal.

According to an embodiment, the capacitor may include a first capacitor and a second capacitor connected in parallel, such that one end of the first capacitor and one end of the second capacitor are connected together to the second terminal, and another ends of the first capacitor and of the second capacitor are connected to the ground.

A further embodiment is directed to a communication device. The communication device may include the single pole double throw switch described in the above embodiments, an antenna connected to the second terminal of the single pole double throw switch; and a control circuit configured to provide a first control voltage to the first control terminal and a second control voltage to the second control terminal, such that the first field-effect transistor and the second field-effect transistor are alternatively switched off to allow connection of the antenna with one of the first terminal and the third terminal.

In an embodiment, the second control voltage may be complementary to the first control voltage to allow alternative switch-off of the first field-effect transistor and the second field-effect transistor.

In an embodiment, a "circuit" in the context of this description may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail, below may also be understood as a "circuit" in accordance with an alternative embodiment.

A further embodiment is directed to a single pole multiple throw switch, which may include a plurality of single pole single throw switches described in the embodiments above, wherein the second terminals of the plurality of single pole single throw switches are connected to each other.

In a further embodiment, a communication device including the single pole multiple throw switch is provided.

Various embodiments described above in the context of the single pole single throw switch are analogously valid for the single pole double throw switch, the single pole multiple throw switch, and the communication device using the corresponding single pole single throw switch.

Figure 2:
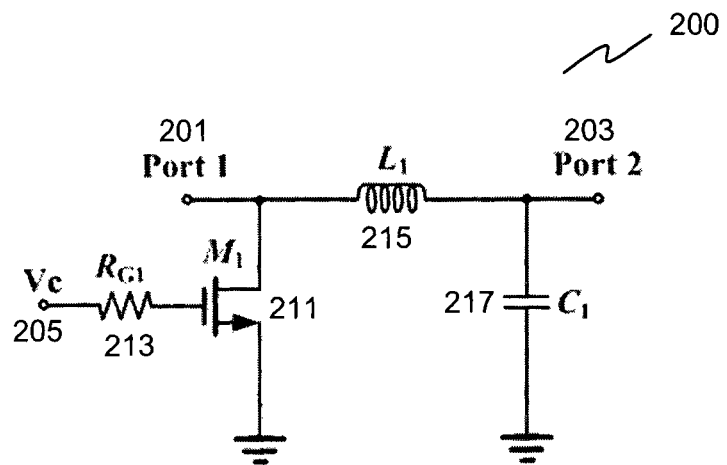
FIG. 2 shows a single pole single throw (SPST) switch according to an embodiment.

FIG. 2 shows a single pole single throw (SPST) switch 200 according to an embodiment.

The SPST switch 200 includes a first terminal 201 (port 1), a second terminal 203 (port 2) and a control terminal 205.

A field-effect transistor $M_1$ 211 has a drain connected to the first terminal 201, a source connected to the ground, and a gate. A bias resistor $R_{G1}$ 213 is connected between the gate of the field-effect transistor 211 and the control terminal 205.

An inductor $L_1$ 215 is connected between the first terminal 201 and the second terminal 203.

The SPST switch 200 further includes a capacitor $C_1$ 217 having one end connected to the second terminal 203 and another end connected to the ground.

Figure 3:
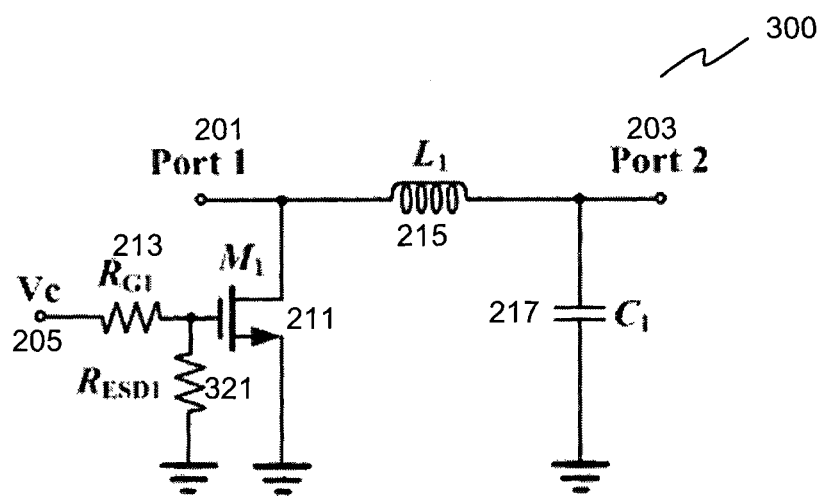
FIG. 3 shows a single pole single throw (SPST) switch according to another embodiment.

FIG. 3 shows a single pole single throw (SPST) switch 300 according to another embodiment. Similar to the SPST switch 200 of FIG. 2, the SPST switch 300 includes a first terminal 201 (port 1), a second terminal 203 (port 2), a control terminal 205, a field-effect transistor $M_1$ 211, a bias resistor $R_{G1}$ 213, an inductor $L_1$ 215, and a capacitor $C_1$ 217 arranged in a similar layout.

The field-effect transistor $M_1$ 211 in the SPST switches 200, 300 may serve as an electrostatic discharge (ESD) protection device to allow ESD event at the ports 201, 203.

To further enhance the breakdown characteristics of the field-effect transistor $M_1$ 211, the SPST switch 300 further includes a protective resistor $R_{ESD1}$ 321 having one end connected to the gate of the field-effect transistor 211 and another end connected to the ground for the purpose of forcing a uniform gate-assisted bipolar breakdown in case of an ESD event. In an exemplary embodiment, the protective resistor 321 may have a resistance of about 100 kΩ. In other embodiments, the protective resistor 321 may have a resistance of more than 100 kΩ, depending on the protection requirement of the SPST switch 300.

Different from the symmetric π-matching topology of the SPST switch in FIG. 1, the topology of the SPST switches 200, 300 in FIGS. 2 and 3 includes a capacitor $C_1$ 211 (also referred to as a shunt capacitor) in place of the shunt transistor $M_2$ in FIG. 1, which exhibits an asymmetric feature.

When a control voltage Vc is configured to be sufficiently high (e.g. higher than a threshold voltage of the field-effect transistor 211) and applied to the gate of the field-effect transistor $M_1$ 211 through the bias resistor $R_{G1}$ 213, the field-effect transistor $M_1$ 211 is turned on to perform the function of isolation between the first terminal 201 and the second terminal 203. Accordingly, the SPST switch 200, 300 is switched off, so as to disallow transmission of any RF signal between the first terminal 201 and the second terminal 203. The isolation of the topology of the SPST switch 200, 300 may be primarily determined by the field-effect transistor $M_1$ 211. Accordingly, the size of the field-effect transistor $M_1$ 211 may be chosen to be larger, e.g. larger than the field-effect transistors of FIG. 1, in order to achieve the desired isolation between the first terminal 201 and the second terminal 203.

Figure 4:
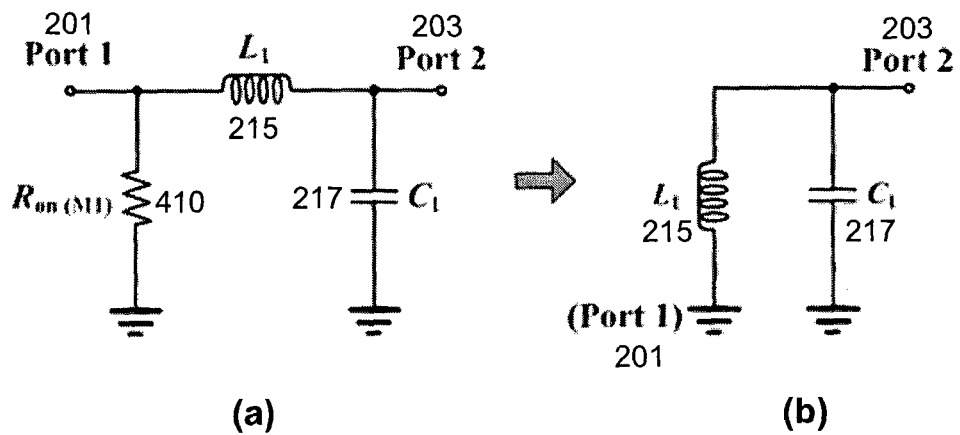
FIG. 4(*a*) shows a small-signal equivalent circuit for the SPST switch in the switched-off state according to an embodiment, FIG. 4(*b*) shows a simplified circuit of FIG. 4(*a*).

FIG. 4(a) shows a small-signal equivalent circuit for the SPST switch 200, 300 in the switched-off state according to an embodiment. When the field-effect transistor $M_1$ 211 is turned on, the on-resistance $R_{on(M1)}$ 410 of the field-effect transistor $M_1$ 211 features a low value of a few ohms. The first terminal 201 may thus be regarded as being directly shortened to ground, so that the inductor $L_1$ 215 and the capacitor $C_1$ 217 form a resonator which is further simplified in FIG. 4(b).

Figure 5:
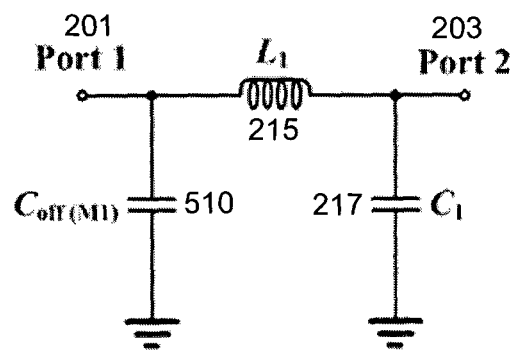
FIG. 5 shows a small-signal equivalent circuit for the SPST switch in the switched-on state according to an embodiment.

When the control voltage Vc is configured to be a low voltage (e.g. lower than the threshold voltage of the field-effect transistor 211) and applied to the gate of the field-effect transistor $M_1$ 211 through the bias resistor $R_{G1}$ 213, the field-effect transistor $M_1$ 211 is turned off and may be simplified as one shunt off-capacitance $C_{off(M1)}$ 510 as shown in FIG. 5.

FIG. 5 shows a small-signal equivalent circuit for the SPST switch 200, 300 in the switched-on state according to an embodiment. The combination of the inductor $L_1$ 215, the capacitor $C_1$ 217, and the off-capacitance $C_{off(M1)}$ 510 form a π-impedance-matching network between the first terminal 201 and the second terminal 203. In this embodiment, the SPST switch 200, 300 is switched on to allow transmission of the signal between the first terminal 201 and the second terminal 203.

Figure 6:
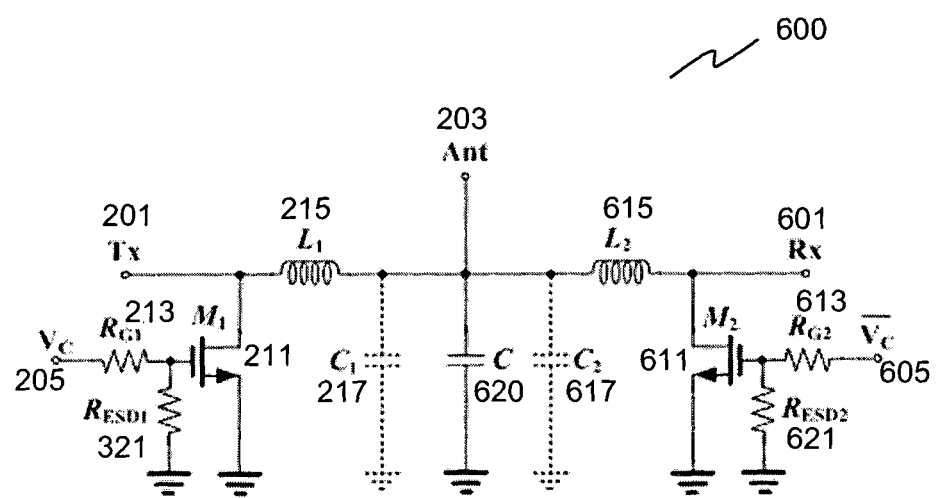
FIG. 6 shows a single pole double throw (SPDT) switch according to an embodiment.

FIG. 6 shows a single pole double throw (SPDT) switch 600 according to an embodiment.

The SPDT switch may include two elementary asymmetric SPST switches (e.g. SPST switches 200, 300 described in the above embodiments) in a back-to-back connection. The SPDT switch 600 may be used as a transmit/receive switch, wherein one SPST switch may form a transmitting (Tx) path and the other SPST switch may form a receiving (Rx) path.

In FIG. 6, the SPDT switch 600 may include a first terminal 201, a second terminal 203 and a third terminal 601; a first control terminal 205 and a second control terminal 605. A first field-effect transistor $M_1$ 211 is included with a drain connected to the first terminal 201, a source connected to the ground, and a gate. A first bias resistor $R_{G1}$ 213 is connected between the gate of the first field-effect transistor $M_1$ 211 and the first control terminal 201. A first inductor $L_1$ 215 is connected between the first terminal 201 and the second terminal 203.

The SPDT switch 600 may further include a second field-effect transistor $M_2$ 611 having a drain connected to the third terminal 601, a source connected to the ground, and a gate; a second bias resistor $R_{G2}$ 613 connected between the gate of the second field-effect transistor $M_2$ 611 and the second control terminal 203; a second inductor $L_2$ 615 connected between the second terminal 203 and the third terminal 601.

In one embodiment, a first capacitor $C_1$ 217 and a second capacitor $C_2$ 617 are provided, having one end connected to the second terminal 203 and another end connected to the ground as represented by dash lines in FIG. 6. In another embodiment, the first capacitor $C_1$ 217 and a second capacitor $C_2$ 617 may be merged into one shunt capacitor and replaced by the shunt capacitor C 620.

In an embodiment, the SPDT switch 600 may further include a first protective resistor $R_{ESD1}$ 321 having one end connected to the gate of the first field-effect transistor $M_1$ 211 and another end connected to the ground; and a second protective resistor $R_{ESD2}$ 621 having one end connected to the gate of the second field-effect transistor $M_2$ 611 and another end connected to the ground. The first and the second protective resistors 321, 621 may provide protection in case of an electrostatic discharge (ESD) event.

In one embodiment, the components 211, 213, 215, 217, 321 of the first SPST may have the same parameters as the corresponding components 611, 613, 615, 617, 621 of the second SPST, so as to simplify the design of the SPDT switch 600. Illustratively, the first inductor $L_1$ 215 and the second inductor $L_2$ 615 may have the same inductance; the first bias resistor $R_{G1}$ 213 and the second bias resistor $R_{G2}$ 613 may have the same resistance; the first field-effect transistor $M_1$ 211 and the second field-effect transistor $M_2$ 611 may have the same on-resistance and off-capacitance; and the first protective resistor $R_{ESD1}$ 321 and the second protective resistor $R_{ESD2}$ 621 may have the same resistance. In other embodiments, the components of the first SPST and the corresponding components of the second SPST may have different parameters, depending on the design requirement of the SPDT switch 600.

In an embodiment wherein the SPDT switch 600 is used as a transmitting/receiving switch, the first terminal 201 may be referred to as a transmitting (Tx) port, and the third terminal 601 may be referred to as a receiving (Rx) port. The second terminal 203, as the common node of two SPST switches, is referred to as an antenna (Ant) port, which may be connected to an antenna for signal transmission/reception.

A first control voltage and a second control voltage are respectively applied to the first control terminal 205 and the second control terminal 605, to control the switched-on or switched-off states of the first field-effect transistor $M_1$ 211 and the second field-effect transistor $M_2$ 611.

In an embodiment, the first control voltage and the second control voltage are configured to be complementary to each other such that when the first control voltage is higher than the threshold voltage of the first field-effect transistor $M_1$ 211, the second control voltage is lower than the threshold voltage of the second field-effect transistor $M_2$ 611, and vice versa. Thus, the first field-effect transistor $M_1$ 211 and the second field-effect transistor $M_2$ 611 are alternatively switched on or switched off by the simultaneously applied first and second control voltages.

In an embodiment as shown in FIG. 6, the first control voltage Vc and the second control voltage $\overline{V_C}$ are applied to the first control terminal 205 and the second control terminal 605, respectively.

In the transmitting (Tx) mode, the first control voltage Vc is pulled down to a low voltage (e.g. lower than a threshold voltage of the first transistor 211), whereas the second control voltage $\overline{V_C}$ is pulled up to high voltage (e.g. higher than a threshold voltage of the second transistor 611) synchronously. As a result, the first transistor 211 is turned off and may be simply regarded as one off-capacitance $C_{off(M1)}$ serving as a part of the matching network, which builds a transmitting (Tx) path from the first terminal Tx 201 to the second terminal Ant 203. Correspondingly, the second transistor $M_2$ 611 is turned on to present a small on-resistance $R_{on(M2)}$, which performs an isolation function to separate the third terminal Rx 601 from the first terminal Tx 201 and the second terminal Ant 203.

Figure 7:
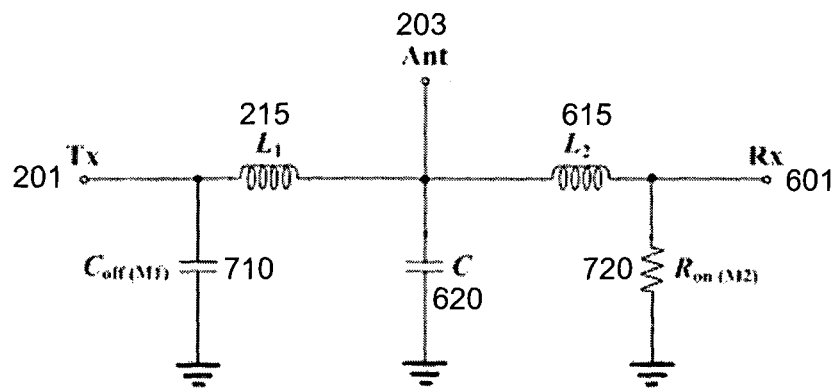
FIG. 7(*a*) shows a small-signal equivalent circuit for the SPDT switch in the transmitting mode according to an embodiment, FIG. 7(*b*) shows a simplified circuit of FIG. 7(*b*).
Figure 7:
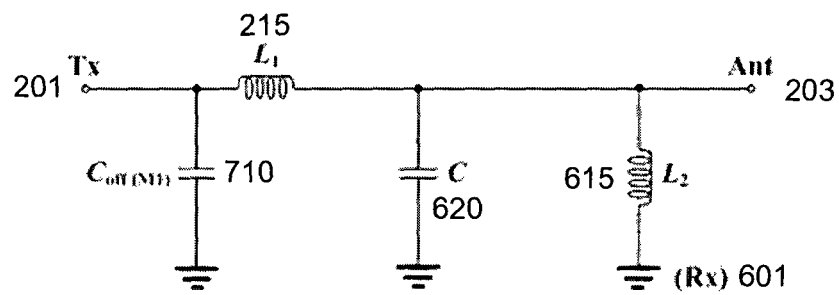

FIG. 7(a) shows a small-signal equivalent circuit for the SPDT switch 600 in the Tx mode according to an embodiment. As shown in FIG. 7(a), the first transistor $M_1$ 211 is turned off to present an off-capacitance $C_{off(M)}$ 710 and the second transistor $M_2$ 611 is turned on to present a small on-resistance $R_{on(M2)}$ 720.

The network between the Tx terminal 201 and the Rx terminal 601 at the DC condition may be represented using the $ABCD_I$ matrix (1) below, wherein $C_{off}=C_{off(M1)}=C_{off(M2)}$, $R_{on}=R_{on(M1)}=R_{on(M2)}$, and $L=L_1=L_2$.

$$\begin{bmatrix} A & B \\ C & D \end{bmatrix}_I = \begin{bmatrix} 1-\omega^2 LC + j\left(\dfrac{2\omega L - \omega^3 L^2 C}{R_{on}}\right) & j(2\omega L - \omega^3 L^2 C) \\ \dfrac{1-\omega^2 LC - 2\omega^2 LC_{off} + \omega^4 L^2 CC_{off}}{R_{on}} + 1-\omega^2 LC - 2\omega^2 LC_{off} + \omega^4 L^2 CC_{off} \\ j(\omega C + \omega C_{off} - \omega^3 LCC_{off}) & \omega^4 L^2 CC_{off} \end{bmatrix} \begin{bmatrix} 1 & 0 \\ \dfrac{1}{R_{on}} & 1 \end{bmatrix} \quad (1)$$

wherein ω denotes the angular frequency.
L denotes the inductance of the inductors 215, 615.
C denotes the capacitance of the capacitor 620.
$C_{off}$ denotes the off-capacitance of the transistors 211, 611.
$R_{on}$ denotes the on-resistance of the transistors 211, 611.
j denotes the imaginary unit.

Hence, the isolation (ISO) of the SPDT switch 600 can be derived as:

$$ISO_{ABCD_I} = -20\log\left|\dfrac{2}{A_I + B_I/Z_0 + C_I Z_0 + D_I}\right| = -20\log\left|\dfrac{2R_{on}}{2R_{on}+Z_0}\right| \quad (2)$$

wherein $Z_0$ denotes the characteristic impedance.

It is obvious from equation (2) that the ISO is mainly determined by the on-resistance $R_{on}$. Assuming $$E = 10^{-\left(\frac{ISO_{ABCD_I}}{20}\right)},$$

$R_{on}$ can be obtained from equation (2) as:

$$R_{on} = \dfrac{E}{2(1-E)}Z_0 \quad (3)$$

$R_{on}$ can also be expressed by $$R_{on} = \dfrac{1}{\mu_n C_{ox} \dfrac{W}{L_T}(V_{gs}-V_{th})} = \dfrac{r_{on}}{W} \quad (4)$$

wherein $V_{gs}$ denotes the gate source voltage of the transistor.
$V_{th}$ denotes the threshold voltage of the transistor.
$\mu_n$ denotes electron mobility.
Cox denotes oxide capacitance per unit area.
$L_T$ denotes the length of the transistor.
W denotes the total width of transistor, and $r_{on}$ denotes the on-resistance per unit transistor width.
Combining (3) with (4), W is derived as:

$$W = \dfrac{2(1-E)r_{on}}{EZ_0} \quad (5)$$

The width of the transistor may thus be determined according to equation (5). For a 65-nm bulk CMOS process adopted in an embodiment, $r_{on}$ is about 372 Ω·μm. If $Z_0$=50Ω and the target ISO=20 dB, W may be then calculated to be 134 μm.

In order to estimate the return loss and insertion loss of the SPDT switch 600, the circuit of FIG. 7(a) may be further simplified to be a circuit in FIG. 7(b), wherein the Rx terminal 601 is shortened to ground due to the low-value $R_{on(M2)}$ 720 discussed above. It is seen from FIG. 7(b) that the Tx path between the Tx terminal 201 and the Ant terminal 203 is formed by a matching network including a π network in series with a resonator, wherein the capacitor 620 is shared by the π network and the resonator. The matching network between the Tx terminal 201 and the Ant terminal 203 may be expressed with the $ABCD_{II}$ matrix (6) below:

$$\begin{bmatrix} A & B \\ C & D \end{bmatrix}_{II} = \begin{bmatrix} 2-\omega^2 LC & j\omega L \\ j\left(\dfrac{1-\omega^2 LC - 2\omega^2 LC_{off} + \omega^4 L^2 CC_{off}}{\omega L}\right) & 1-\omega^2 LC_{off} \end{bmatrix} \quad (6)$$

The input return loss (IRL), the output return loss (ORL), and the insertion loss (IL) of the SPDT switch 600 may be deduced as:

$$IRL_{ABCD_{II}} = -20\log\left|\dfrac{A_{II} + B_{II}/Z_0 - C_{II}Z_0 - D_{II}}{A_{II} + B_{II}/Z_0 + C_{II}Z_0 + D_{II}}\right| \quad (7)$$

$$ORL_{ABCD_{II}} = -20\log\left|\frac{-A_{II} + B_{II}/Z_0 - C_{II}Z_0 + D_{II}}{A_{II} + B_{II}/Z_0 + C_{II}Z_0 + D_{II}}\right| \quad (8)$$

$$IL_{ABCD_{II}} = -20\log\left|\frac{2}{A_{II} + B_{II}/Z_0 + C_{II}Z_0 + D_{II}}\right| \quad (9)$$

Theoretically, the IRL formulized in (7) can exhibit infinite large if the numerator $$A_{II} + B_{II}/Z_0 - C_{II}Z_0 - D_{II} = 1 - \omega^2 L(C - C_{off}) + \quad (10)$$
$$j\left[\frac{\omega L}{Z_0} + \frac{Z_0}{\omega L} + \omega Z_0(\omega^2 LCC_{off} - C - 2C_{off})\right] = 0$$

Accordingly, the real and imaginary parts should be zero:

$$1 - \omega^2 L(C - C_{off}) = 0 \quad (11)$$

$$\frac{\omega L}{Z_0} + \frac{Z_0}{\omega L} + \omega Z_0(\omega^2 LCC_{off} - C - 2C_{off}) = 0 \quad (12)$$

From equation (11), it can be derived that $$L = \frac{1}{\omega^2(C - C_{off})} \quad (13)$$

Substituting (13) into (12), the capacitance C can be expressed as $$C = \frac{3}{2}C_{off} + \frac{1}{2\omega^2 Z_0^2 C_{off}} \quad (14)$$

The inductance of the inductors and the capacitance of the capacitor used in the SPDT may thus be determined according to equations (13) and (14). The transistor with the width W of 134 μm discussed above has the off-capacitance $C_{off}$ of about 78 fF. At the operating frequency (e.g. 60 GHz) and $Z_0$ of 50Ω, the inductance L is estimated to be about 123 pH and the capacitance C is estimated to be about 135 fF from the equations (13) and (14).

In the receiving (Rx) mode, the first control voltage Vc may be set to be a high voltage (e.g. higher than a threshold voltage of the first transistor 211), and the second control voltage $\overline{V_C}$ may be configured to be a low voltage (e.g. lower than a threshold voltage of the second transistor 611) simultaneously. The first field-effect transistor $M_1$ 211 is accordingly turned on, such that the Tx terminal 201 is grounded and is isolated from the other two terminals 203, 601. On the other hand, the second field-effect transistor $M_2$ 611 is turned off to present an off-capacitance $C_{off(M2)}$ 810 and acts as one component of the matching network, which forms the Rx path between the Ant terminal 203 and the Rx terminal 601.

Figure 8:
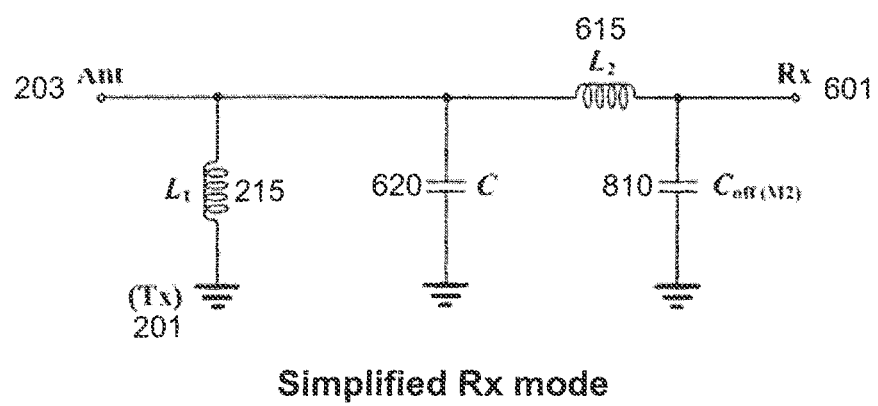
FIG. 8 shows a simplified small-signal equivalent circuit of the SPDT switch in the receiving mode according to an embodiment.

FIG. 8 shows the simplified small-signal equivalent circuit of the SPDT switch in the Rx mode according to an embodiment, which may be considered to be horizontally mirrored from FIG. 7(b) owing to the symmetric topology of the switch 600. Hence, the performance of the switch 600 in the Rx mode may be evaluated by the same matrices and equations (1)-(14) described above.

Figure 9:
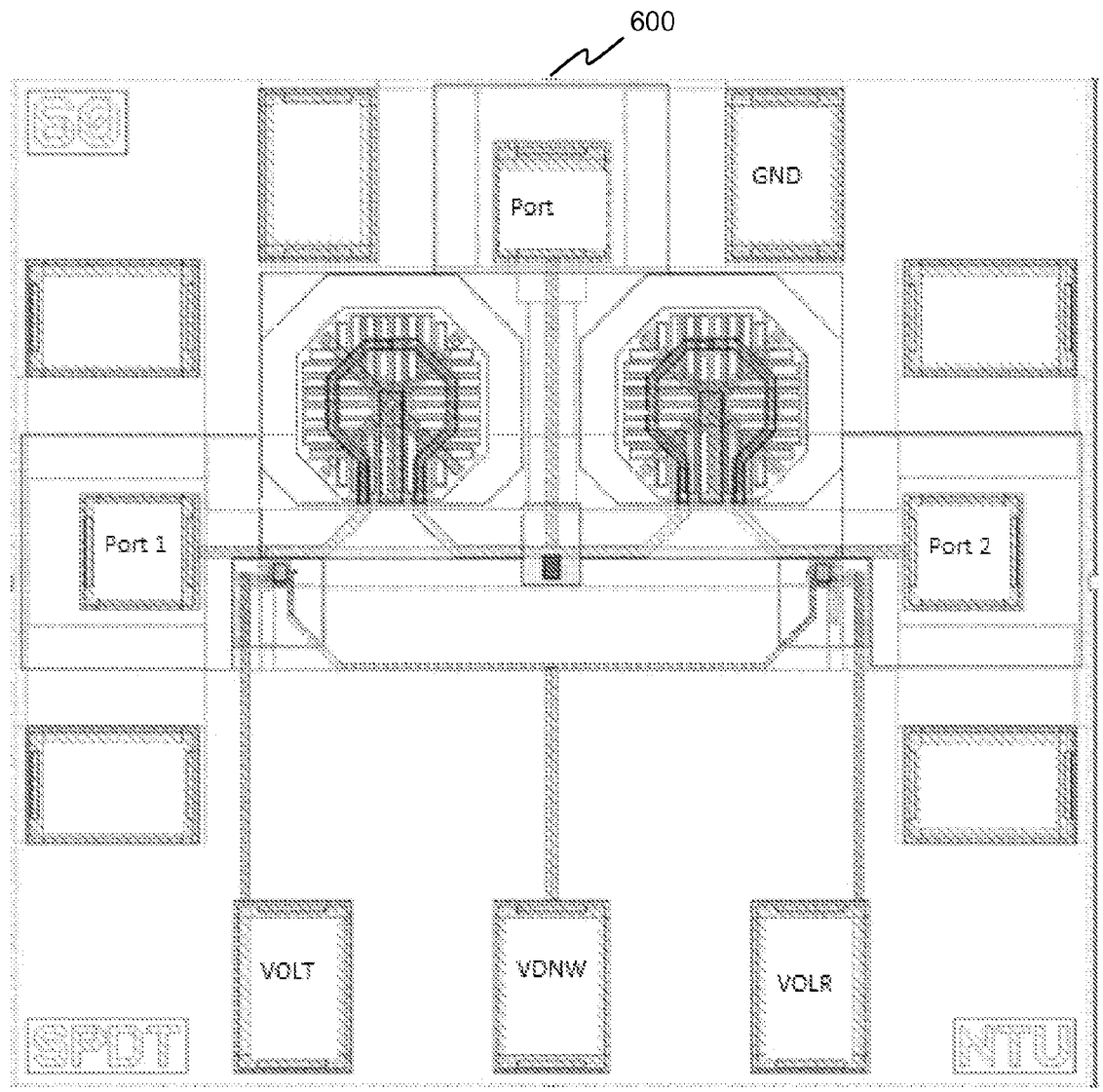
FIG. 9 shows a layout of a SPDT transmit/receive switch according to an embodiment.

In an embodiment, the SPDT transmit/receive switch described above is designed in a 1.2-V 65 nm bulk CMOS RF process with 7-metal back end and thick-metal inductors. Transistors for low-power (LP) wireless applications achieves a cut-off frequency $f_T$ around 200 GHz and a maximum oscillation frequency $f_{MAX}$ around 250 GHz, respectively. The layout of the SPDT switch chip is shown in FIG. 9. The active area is only about 274 μm×136 μm and the whole chip area including all testing pads is 465 μm×437 μm.

Figure 10:
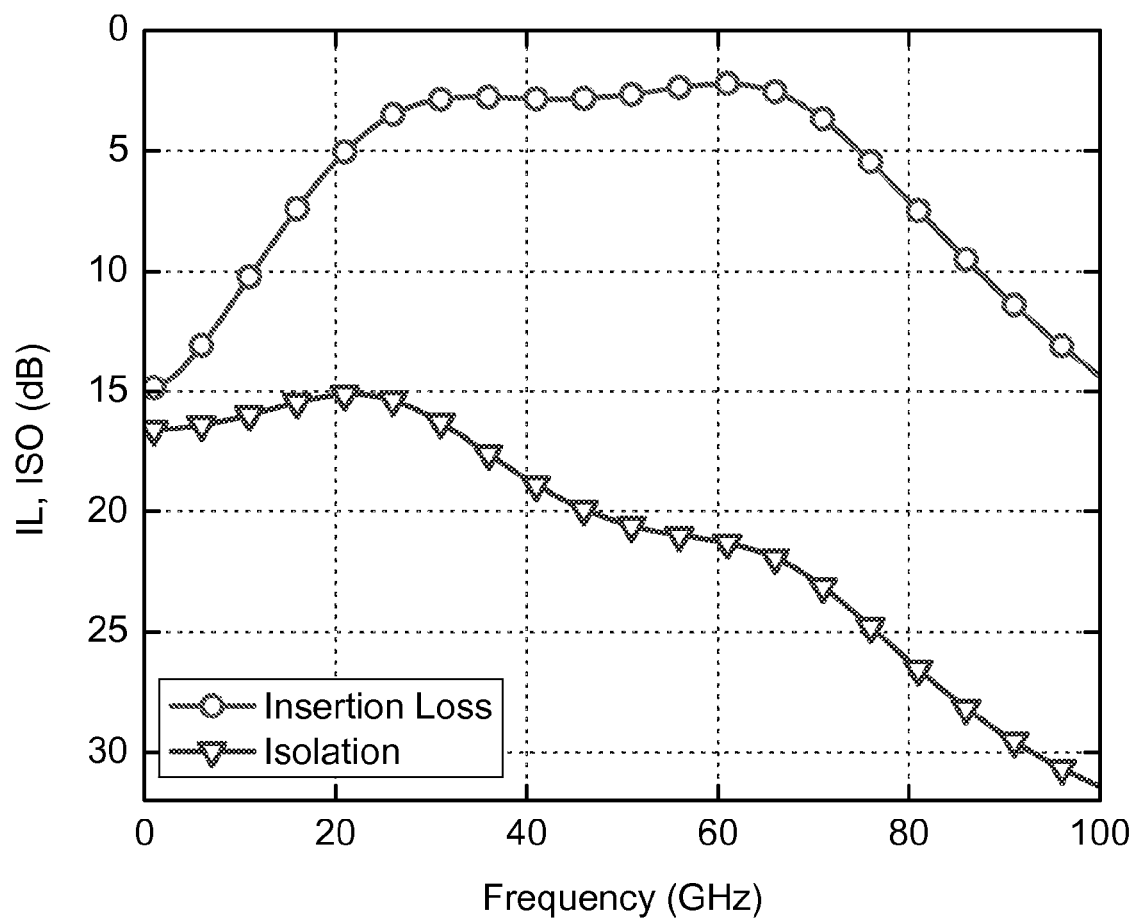
FIG. 10 illustrates the simulated insertion loss and isolation for a SPDT switch according to an embodiment.

FIG. 10 illustrates the simulated insertion loss and isolation for the SPDT switch 600 according to an embodiment. As shown in FIG. 10, the switch achieves an insertion loss of 2.2 dB and an isolation of 21.2 dB at 60 GHz. The insertion loss is smaller than 2.5 dB and the isolation is larger than 21.1 dB over the bandwidth of 57-66 GHz. Actually, the parasitic effects of the testing pads and interconnections should be de-embedded when the switch is integrated with other circuit blocks according to various applications.

Figure 11:
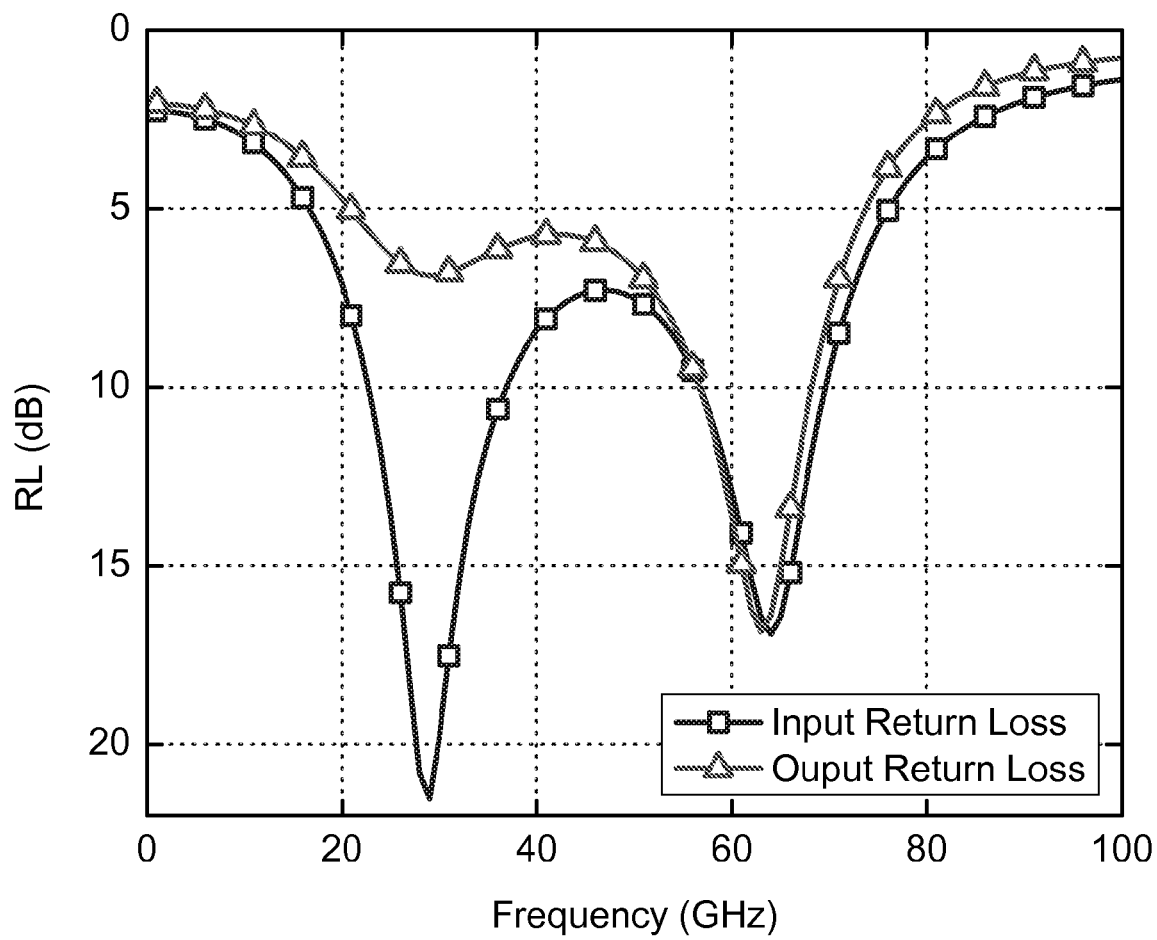
FIG. 11 illustrates the simulated input return loss and output return loss for a SPDT switch according to an embodiment.

FIG. 11 illustrates the simulated return losses for the SPDT switch 600 according to an embodiment. It is shown in FIG. 11 that the input return loss and the output return loss are both better than 10 dB from 57 to 66 GHz, and are 13 dB and 14 dB at 60 GHz, respectively.

The simulated power-handling capability of input $P_{1dB}$ for the switch exhibits 12.1 dBm at 60 GHz. The switching speed of the SPDT switch is simulated by employing an input 60-GHz sinusoid signal of −3 dBm together with a control signal of 50% duty-cycle and 100-MHz pulse. The rise time and fall time of the output signal are 1.23 ns and 1.21 ns, respectively. The fast switching speed can be further improved by decreasing the resistance values of the gate resistors as long as the resistance is still large enough to make the gates open to RF signal.

Figure 12:
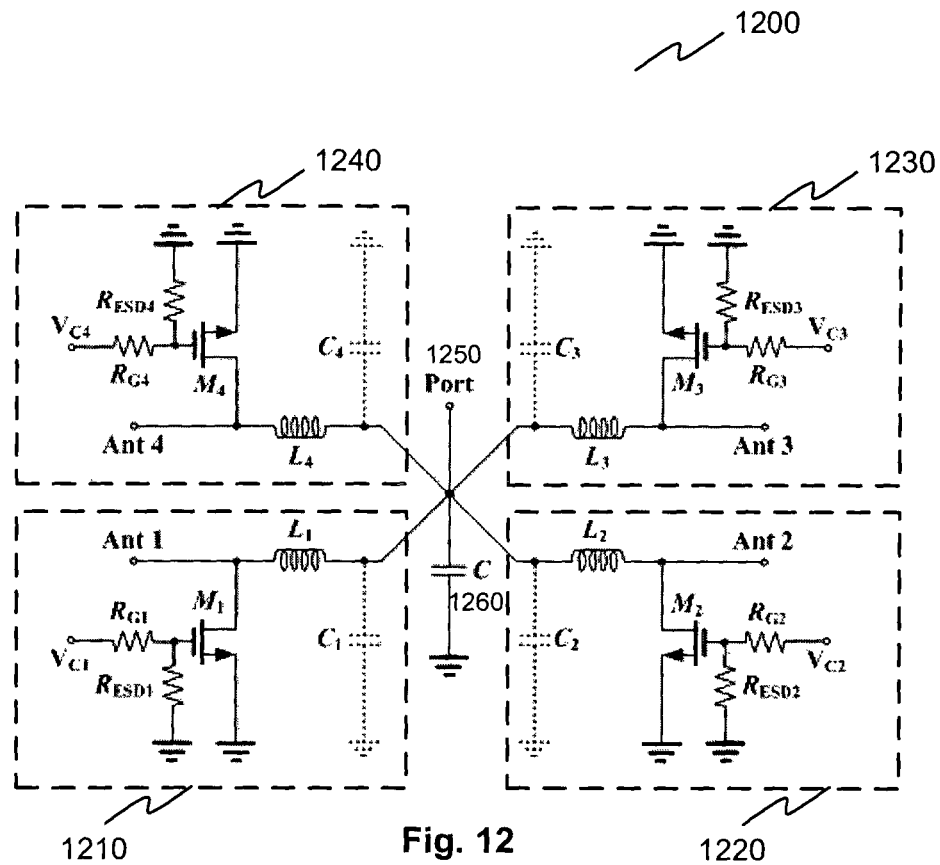
FIG. 12 shows a single pole four throw (SP4T) switch according to an embodiment.

FIG. 12 shows a single pole four throw (SP4T) switch 1200 according to an embodiment.

The SP4T switch 1200 may be constructed by four asymmetric SPST switches 1210, 1220, 1230, 1240 in a back-to-back connection. The SPST switches 200, 300 described in FIGS. 2 and 3 above may be used as the SPST switches 1210, 1220, 1230, 1240. In FIG. 12, the SPST switches 1210, 1220, 1230, 1240 have the same structure as the SPST switch 300 described above.

Each of the SPST switches 1210, 1220, 1230, 1240 may be used as a Tx path or a Rx path. The first terminals of the four SPST switches are denoted as Ant1, Ant2, Ant3, Ant4, respectively. The four SPST switches (e.g. the second terminals of the four SPST switches) are connected at a common node denoted as Port 1250. The capacitors $C_1, C_2, C_3, C_4$ of the four SPST switches are represented by dash lines in FIG. 12. Since these four capacitors are in parallel connection, they may be combined into and replaced by one shunt capacitor C 1260 in an embodiment.

In an illustrative embodiment of the SP4T switch 1200 in the Tx or Rx mode, the control voltage $V_{C1}$ for the first SPST switch 1210 may be configured to be a low voltage (e.g. lower than the threshold voltage of the field-effect transistor in the SPST switch 1210), whereas the control voltages $V_{C2}, V_{C3}$, and $V_{C4}$ for the other three SPST switches 1220, 1230, 1240 may be set to a high voltage (e.g. higher than the respective threshold voltage of the field-effect transistors in the SPST switches 1220, 1230, 1240) synchronously. Consequently, the transistor $M_1$ of the first SPST switch 1210 is turned off to present one off-capacitance $C_{off(M1)}$ acting as a part of the matching network, which forms a Tx path from the Port 1250 to the terminal Ant1 of the first SPST switch 1210 or a Rx path from the terminal Ant1 to the Port 1250. Correspondingly, transistors $M_2$, $M_3$, and $M_4$ of the other three SPST switches 1220, 1230, 1240 are turned on to achieve small on-resistances $R_{on(M2)}$, $R_{on(M3)}$, and $R_{on(M4)}$, which not only separate the terminals Ant2, Ant3, and Ant4 of the other three SPST switches 1220, 1230, 1240 from the Port 1250 and the terminal Ant1, but also isolate the terminals Ant2, Ant3, and Ant4 themselves.

Figure 13:
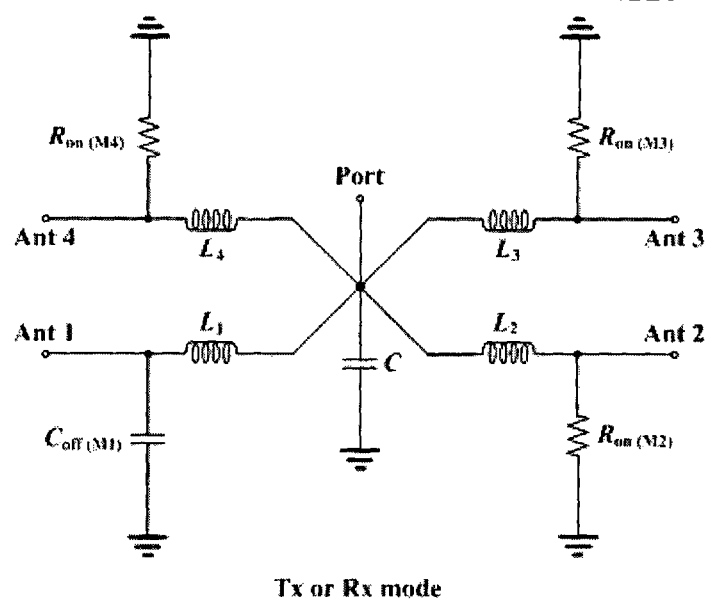
FIG. 13 shows a small-signal equivalent circuit of a SP4T switch in the Tx or Rx mode according to an embodiment.

FIG. 13 shows a small-signal equivalent circuit of the SP4T switch 1200 in the Tx or Rx mode according to an embodiment.

Assuming $C_{off}=C_{off(M1)}=C_{off(M2)}=C_{off(M3)}=C_{off(M4)}$, $R_{on}=R_{on(M1)}=R_{on(M2)}=R_{on(M3)}=R_{on(M4)}$, and $L=L_2=L_3=L_4$, the network between the terminals Ant1 and Ant 2 may be represented using the matrix (15) of $ABCD_{III}$ below:

$$\begin{bmatrix} A & B \\ C & D \end{bmatrix}_{III} = \begin{bmatrix} 1-\omega^2 LC + j\left(\dfrac{2\omega L - \omega^3 L^2 C}{R_{on}}\right) & j(2\omega L - \omega^3 L^2 C) \\ \dfrac{1-\omega^2 LC - 2\omega^2 LC_{off} + \omega^4 L^2 CC_{off}}{R_{on}} + & 1-\omega^2 LC - 2\omega^2 LC_{off} + \\ j(\omega C + \omega C_{off} - \omega^3 LCC_{off}) & \omega^4 L^2 CC_{off} \end{bmatrix}$$

(15)

The isolation between the terminals Ant1 and Ant2 may be evaluated using the same equation (2) by simply replacing the parameters $A_I$, $B_I$, $C_I$, and $D_I$ of matrix (1) with the corresponding parameters $A_{III}$, $B_{III}$, $C_{III}$, and $D_{III}$ of matrix (15). The isolation between the terminals Ant1 and Ant3 (or Ant4) is the same as that between the terminals Ant1 and Ant2, due to the symmetric topology of the SP4T switch.

Similarly, the network between the terminals Ant 2 and Ant3 may be represented by the following $ABCD_{IV}$ matrix (16):

$$\begin{bmatrix} A & B \\ C & D \end{bmatrix}_{IV} = \begin{bmatrix} 1-\omega^2 LC + j\left(\dfrac{2\omega L - \omega^3 L^2 C}{R_{on}}\right) & j(2\omega L - \omega^3 L^2 C) \\ \dfrac{2-2\omega^2 LC}{R_{on}} + & \\ j\left(\dfrac{R_{on}^2 \omega C + 2\omega L - \omega^3 L^2 C}{R_{on}^2}\right) & 1-\omega^2 LC + j\left(\dfrac{2\omega L - \omega^3 L^2 C}{R_{on}}\right) \end{bmatrix}$$

(16)

Hence, the isolation (ISO) between the terminals Ant2 and Ant3 of the SP4T switch can also be derived using the equation (2) by substituting the parameters $A_1$, $B_1$, $C_1$, and $D_1$ of matrix (1) with the corresponding parameters $A_{IV}$, $B_{IV}$, $C_{IV}$, and $D_{IV}$ of matrix (16). Owing to the symmetric topology of the SP4T switch, the isolation between any two terminals among Ant 2~Ant 4 exhibits the identical performance.

Due to the small on-resistances $R_{on(M2)}$, $R_{on(M3)}$, and $R_{on(M4)}$, the terminals Ant2, Ant3 and Ant4 may be considered to be simultaneously grounded, such that the inductors $L_2$, $L_3$, and $L_4$ may also be considered to be grounded. The circuit of FIG. 13 in the Rx mode may be further approximated/simplified to be the circuit in FIG. 14(a).

Figure 14:
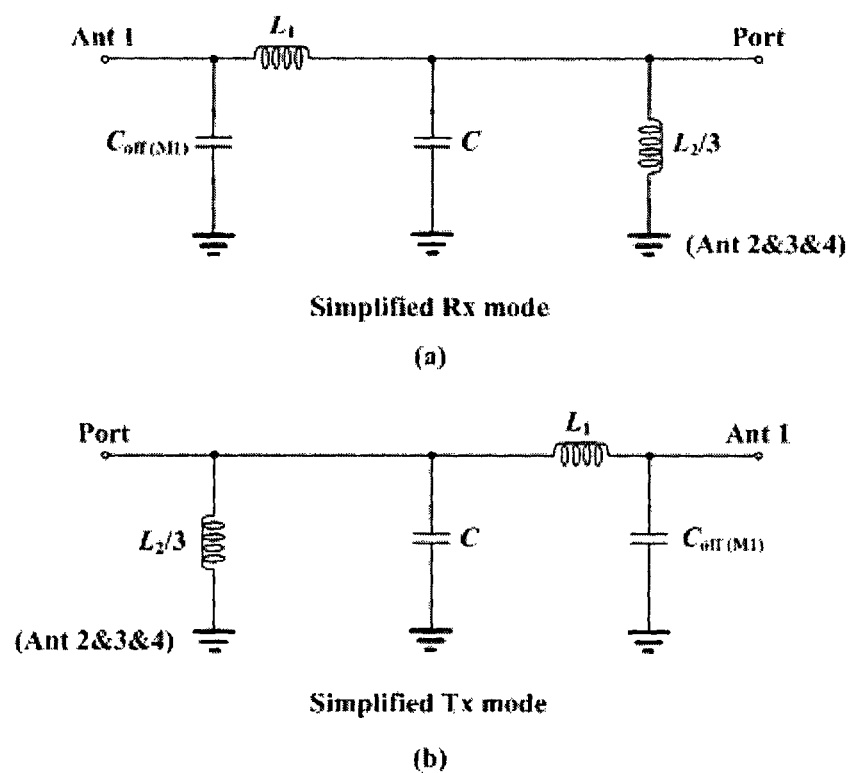
FIG. 14(*a*) shows a simplified circuit of FIG. 13 in the Rx mode according to an embodiment, FIG. 14(*b*) shows a simplified circuit of FIG. 13 in the Tx mode according to an embodiment.

In FIG. 14(a), the inductors $L_2$, $L_3$, and $L_4$ are represented by one inductor having an inductance of $L_2/3$, since the inductors are in parallel connection. In this embodiment, it is assumed that the inductance of $L_2$, $L_3$, and $L_4$ are the same, and the combined inductance becomes ⅓ of the original value.

It is shown in FIG. 14(a) that the matching network between the terminal Ant1 and the Port is constructed by a π network and a resonator, which are connected in series and share the shunt capacitance C. The matching network between Ant1 and Port can be expressed using the $ABCD_V$ matrix (17) below:

$$\begin{bmatrix} A & B \\ C & D \end{bmatrix}_V = \begin{bmatrix} 4-\omega^2 LC & j\omega L \\ j\left(\dfrac{3-\omega^2 LC - 4\omega^2 LC_{off} + \omega^4 L^2 CC_{off}}{\omega L}\right) & 1-\omega^2 LC_{off} \end{bmatrix}$$

(17)

Therefore, the insertion loss (IL), input return loss (IRL), and output return loss (ORL) of the SP4T switch 1200 may be estimated using the same equations (7)-(9) by substituting the parameters $A_{II}$, $B_{II}$, $C_{II}$, and $D_{II}$ of matrix (6) with the corresponding parameters $A_V$, $B_V$, $C_V$, and $D_V$ of matrix (17).

The off-state transistors may determine the power-handling capability of the SP4T switch 1200, and thus the value of input $P_{1dB}$ may be roughly the same as that of the SPDT switch 600.

The simplified small-signal equivalent circuit of the SPDT switch 1200 in the Tx mode is shown in FIG. 14(b), which can be easily obtained by reflecting from FIG. 14(a) owing to the symmetric topology of the SP4T switch 1200. The performance of ISOs, IRL, ORL, and $P_{1dB}$ in the Tx mode are identical with those in the Rx mode discussed above.

Figure 15:
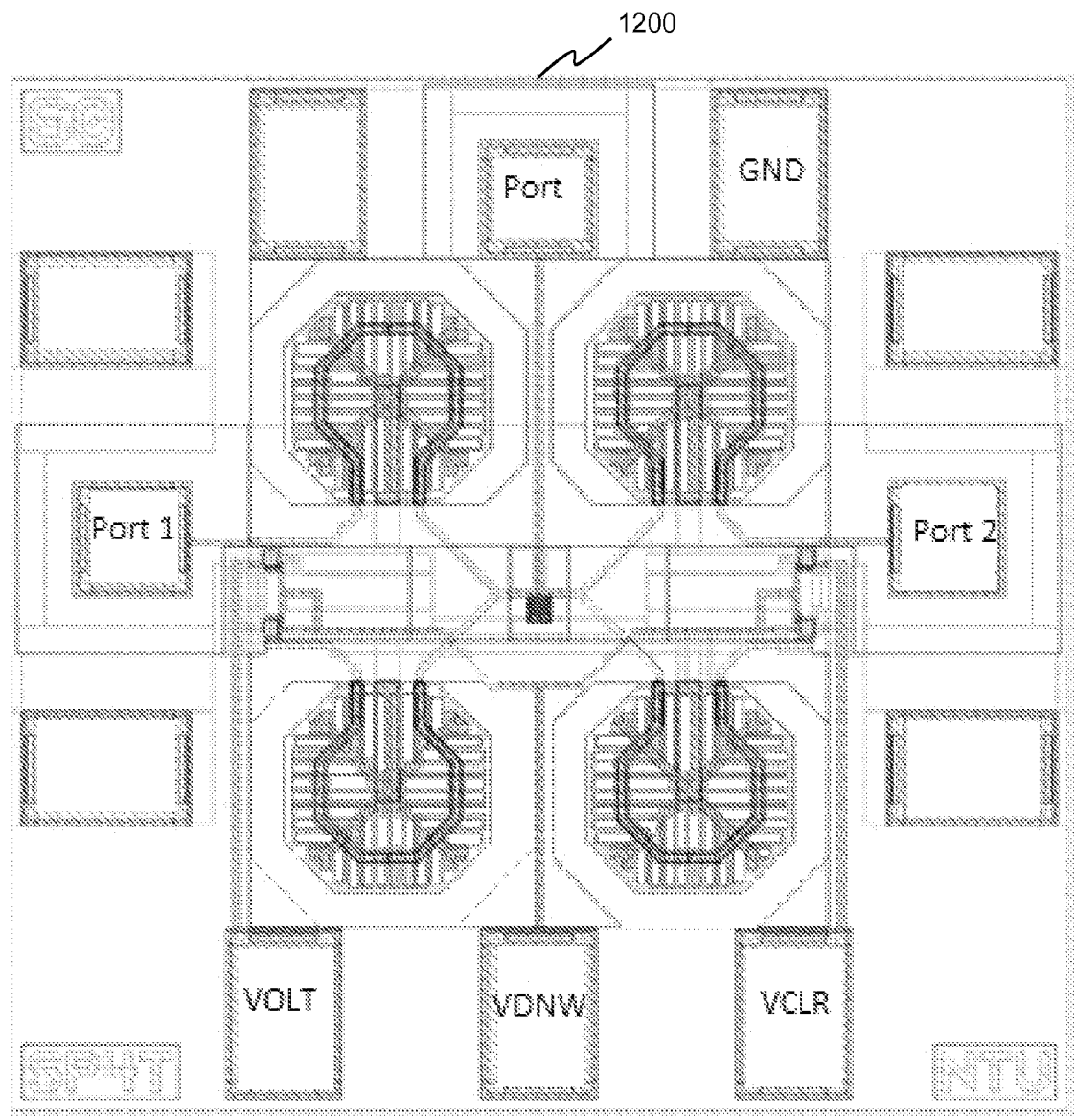
FIG. 15 shows a layout of a SP4T switch according to an embodiment.

FIG. 15 shows the layout of the SP4T switch according to an embodiment, which adopts a 1.2-V 65-nm bulk CMOS RF process similar to FIG. 9 above. The active area is 274 μm×262 μm, and the whole area including all testing pads is 465 μm×456 μm. In FIG. 15, only the terminals Ant1, Ant2, Port are shown. The terminals Ant3 and Ant4 are terminated internally with 50Ω resistances for convenience of measurements, since they have identical results to that of Ant1 and Ant2 due to the symmetry of the switch topology.

Figure 16:
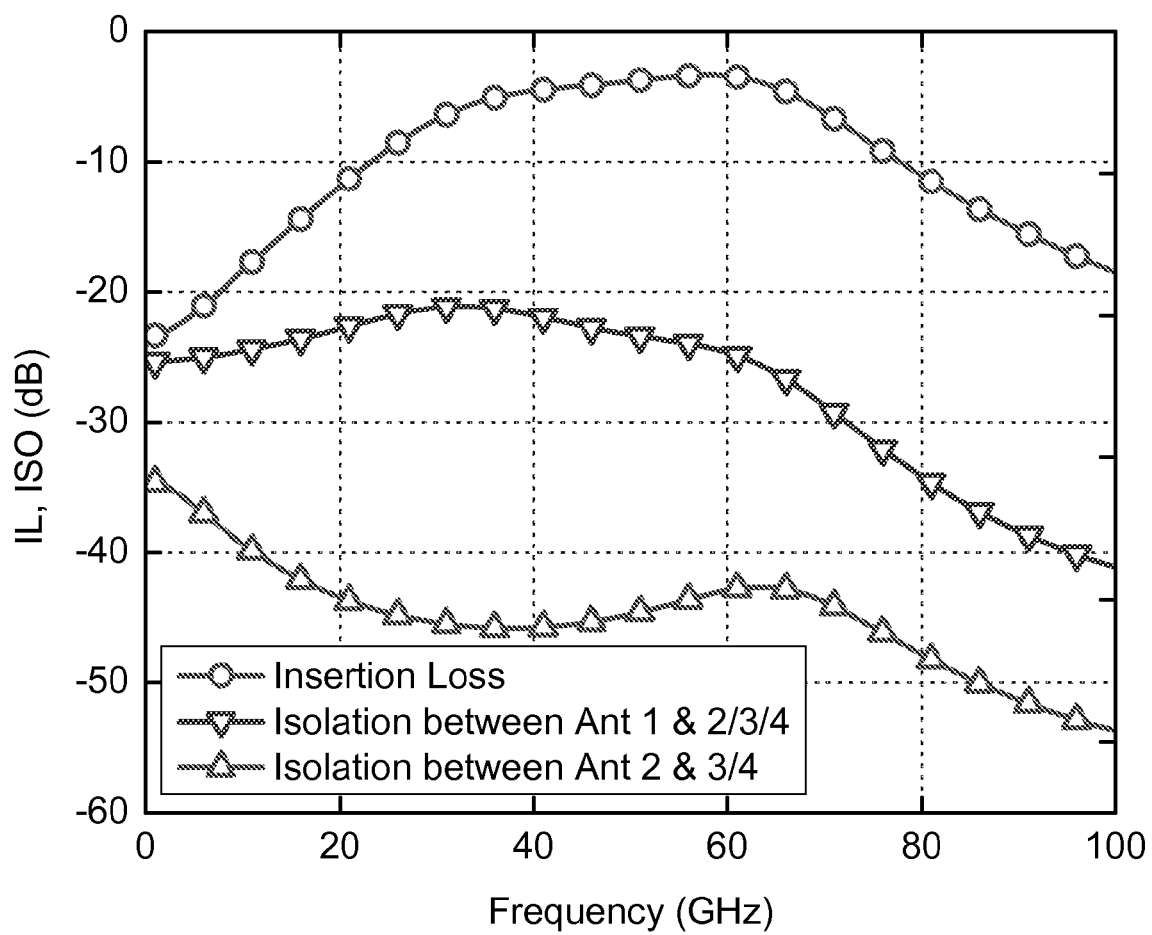
FIG. 16 illustrates the post-layout simulations of the insertion loss and isolation for a SP4T switch according to an embodiment.

FIG. 16 illustrates the post-layout simulations of the insertion loss and isolation for the SP4T switch according to an embodiment. It is observed that the SP4T switch has an insertion loss of 3.4 dB at 60 GHz, and an insertion loss of less than 4.2 dB over the bandwidth of 57-66 GHz. An isolation of 25.7 dB between Ant1 and Ant 2/3/4 is achieved at the 60 GHz, and an isolation larger than 25 dB between Ant1 and Ant 2/3/4 is achieved for 57-66 GHz frequency band. The isolation between Ant2 and Ant 3/4 is 43 dB at 60 GHz, and is larger than 42 dB over the bandwidth of 57-66 GHz.

Figure 17:
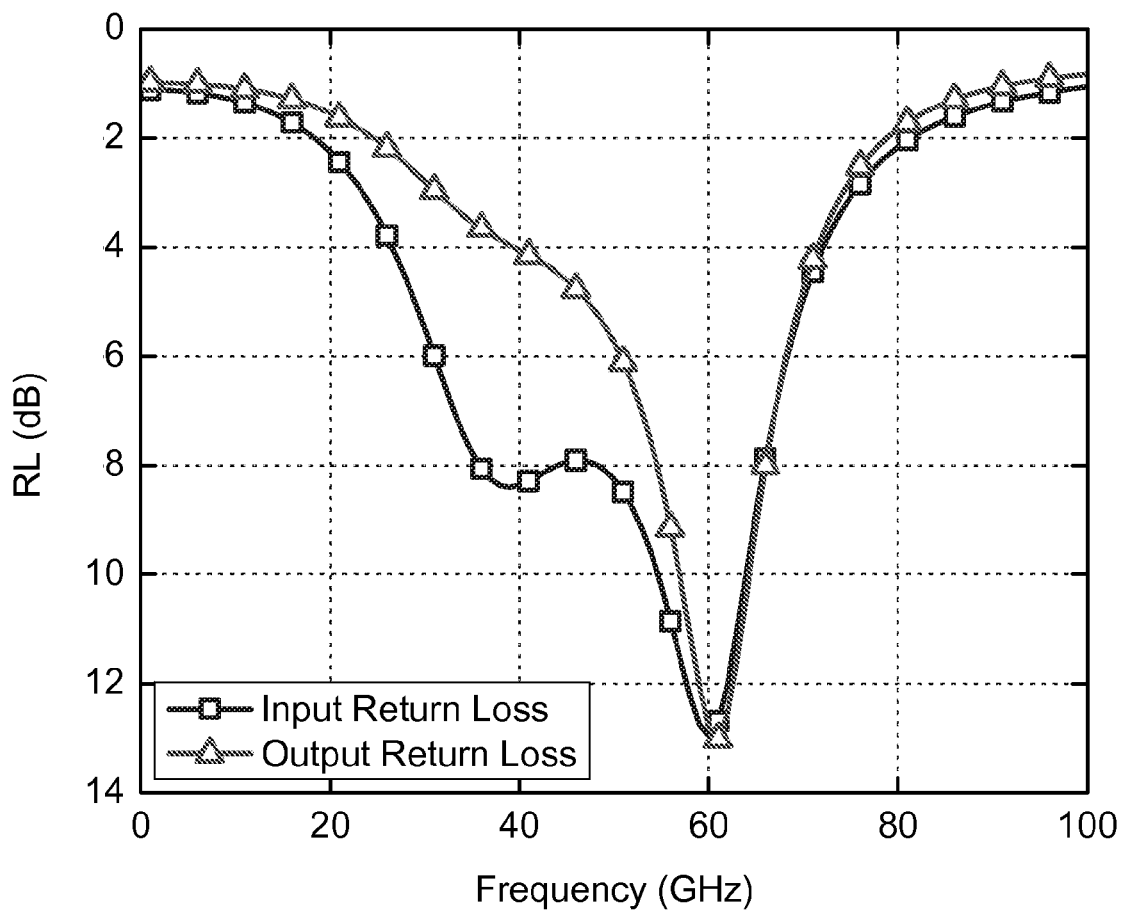
FIG. 17 illustrates the simulated return losses for a SP4T switch according to an embodiment.

FIG. 17 illustrates the simulated return losses for the SP4T switch according to an embodiment. It is seen from FIG. 17 that the input return loss and the output return loss are both around 13 dB at 60 GHz, and are both larger than 8 dB from 57 GHz to 66 GHz. These post-layout simulation results include the parasitic effects of the testing pads and interconnections, which should be de-embedded after measurement since the switch will be internally integrated with other circuit blocks.

The simulated power-handling capability for the switch is 11.1 dBm at 60 GHz. The switching speed of the SP4T switch is simulated under the identical condition of the SPDT switch described above, and the simulated rise and fall time are respectively 1.2 ns and 1.17 ns, which are both faster than that of the SPDT switch. This is because the smaller shunt transistors $M_1$ and $M_2$ achieve smaller total gate-to-ground capacitances represented with $C_{G1}$ and $C_{G2}$, which include the parasitic and intrinsic capacitances seen from the gates of two transistors. In terms of the time constant expression $\tau=R_{G1}C_{G1}=R_{G2}C_{G2}$, the smaller time constant $\tau$ effectively quickens the switching speed.

The SP4T switch 1200 described above includes four SPST switches in accordance with various embodiments. Other embodiments may provide a SPMT switch including a plurality of SPST switches described in various embodiments above.

The asymmetric SPST switch in various embodiments above solves the problem of input impedance mismatch for design of SPDT and SPMT switches by using a single capacitor, which eliminate the need of the bulky quarter-wave length impedance transformers and other complex impedance matching networks. Accordingly, the SPST switch of various embodiments provide a solution for small-size, low-cost, and high-performance millimeter-wave switches.

The performance of SPDT and SP4T switches in 65-nm CMOS have been evaluated above, which achieve competitive performances to those of the reported SPDT and SP4T switches in CMOS. For example, the SPDT switch uses a minimum number of components and consumes 5-20 times smaller silicon area as compared with existing designs. In addition, the ESD protection are provided in the switches according to an embodiment.

The switches of the embodiments above have many applications. For example, the SPST switches may be used as an attenuator, self-test of radio transceiver, or phase shifter, etc. The SPDT switches may be used as an antenna switch, e.g. for 60 GHz radio, 77 GHz radar, and 94 GHz imagers. The SP4T switches may be used for beam-forming antennas and multiple-input-multiple-output (MIMO) systems.

The SPST switches, SPDT switches and SPWT switches described in various embodiments above may be used in a communication device for various communication applications.

Figure 18:
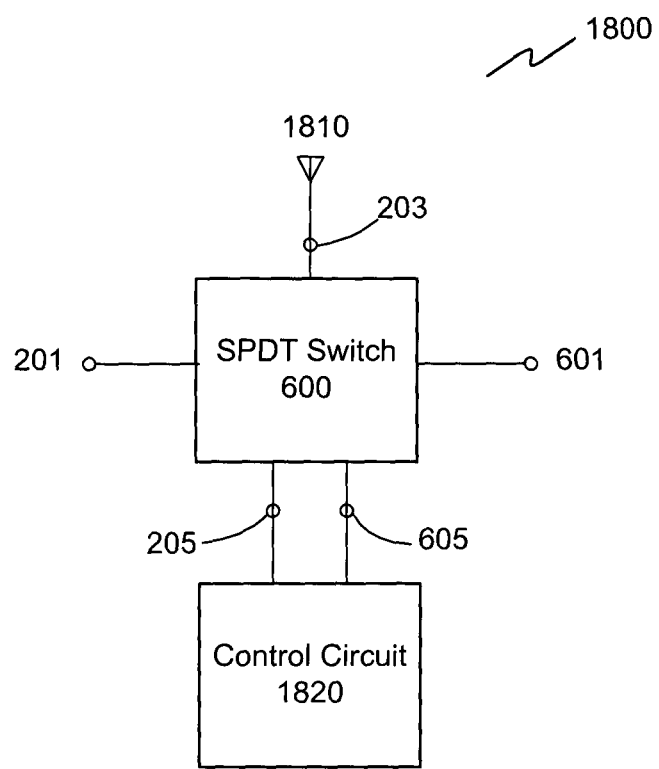
FIG. 18 shows a communication device according to an embodiment.

FIG. 18 shows a communication device 1800 according to an embodiment.

The communication device 1800 may include a SPDT switch 600 as described in the embodiments above. The SPDT switch 600 includes a first terminal 201, a second terminal 203, a third terminal 601, a first control terminal 205, and a second control terminal 605.

The communication device 1800 further include an antenna 1810 connected to the second terminal 203 of the SPDT switch 600.

A control circuit 1820 is further included, which is configured to provide a first control voltage to the first control terminal 205 and provide a second control voltage to the second control terminal 605, such that the first field-effect transistor and the second field-effect transistor in the SPDT switch 600 are alternatively switched off to allow connection of the antenna 1810 with one of the first terminal 201 and the third terminal 601.

In an embodiment, the second control voltage may be complementary to the first control voltage, such that the simultaneously applied first and second control voltages allow alternative switch-off of the first field-effect transistor and the second field-effect transistor.

Under the control of the control circuit 1820, a communication path is thus formed between the antenna 1810 and one of the first and the third terminals of the SPDT switch 600 for signal transmission or reception.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A single pole double throw switch, comprising:
a first terminal, a second terminal and a third terminal;
a first control terminal and a second control terminal;
a first field-effect transistor having a drain connected to the first terminal, a source connected to a ground, and a gate;
a first bias resistor connected between the gate of the first field-effect transistor and the first control terminal;
a first inductor connected between the first terminal and the second terminal;
a second field-effect transistor having a drain connected to the third terminal, a source connected to the ground, and a gate;
a second bias resistor connected between the gate of the second field-effect transistor and the second control terminal;
a second inductor connected between the second terminal and the third terminal; and
a capacitor having one end connected to the second terminal and another end connected to the ground;
wherein the first field-effect transistor and the second field-effect transistor have respective widths based on a target isolation of the single pole double throw switch;
wherein each of the first and the second field-effect transistors has a switched-on state exhibiting an on-resistance and a switched-off state exhibiting an off-capacitance;
wherein the single pole double throw switch is configured to form a π-impedance-matching network by the first inductor, the capacitor and the first field-effect transistor exhibiting the off-capacitance, or to form the π-impedance-matching network by the second inductor, the capacitor and the second field-effect transistor exhibiting the off-capacitance, wherein:
the width of the first field-effect transistor is equal to $$\frac{2(1-E)r_{on,1}}{EZ_0},$$

the width of the second field-effect transistor is equal to $$\frac{2(1-E)r_{on,2}}{EZ_0},$$

$$E = 10^{-\left(\frac{ISO}{20}\right)},$$

ISO denotes the target isolation of the single pole double throw switch,
$Z_0$ denotes a characteristic impedance,
$r_{on,1}$ denotes an on-resistance per unit transistor width of the first field-effect transistor, and
$r_{on,2}$ denotes an on-resistance per unit transistor width of the second field-effect transistor.

2. The single pole double throw switch of claim 1, further comprising:
a first protective resistor having one end connected to the gate of the first field-effect transistor and another end connected to the ground; and
a second protective resistor having one end connected to the gate of the second field-effect transistor and another end connected to the ground.

3. The single pole double throw switch of claim 2, wherein the first protective resistor and the second protective resistor have a resistance of about 100 KΩ.

4. The single pole double throw switch of claim 1, wherein the switched-on state and the switched-off state of the first field-effect transistor and the second field-effect transistor are controlled by a first control voltage applied to the first control terminal and a second control voltage applied to the second control terminal, respectively.

5. The single pole double throw switch of claim 1, wherein the capacitor comprises a first capacitor and a second capacitor connected in parallel.

6. The single pole double throw switch of claim 1, wherein a capacitance of the capacitor is set based on an off-capacitance of the first field-effect transistor and the second field-effect transistor.

7. The single pole double throw switch of claim 1, wherein an inductance of the first inductor and an inductance of the second inductor are set based on an off-capacitance of the first field-effect transistor and the second field-effect transistor.

8. A communication device comprising:
a single pole double throw switch that includes:
a first terminal, a second terminal and a third terminal;
a first control terminal and a second control terminal;
a first field-effect transistor having a drain connected to the first terminal, a source connected to the ground, and a gate;
a first bias resistor connected between the gate of the first field-effect transistor and the first control terminal;
a first inductor connected between the first terminal and the second terminal;
a second field-effect transistor having a drain connected to the third terminal, a source connected to the ground, and a gate;
a second bias resistor connected between the gate of the second field-effect transistor and the second control terminal;
a second inductor connected between the second terminal and the third terminal; and
a capacitor having one end connected to the second terminal and another end connected to the ground;
wherein the first field-effect transistor and the second field-effect transistor have respective widths based on a target isolation of the single pole double throw switch;
wherein each of the first and the second field-effect transistors has a switched-on state exhibiting an on-resistance and a switched-off state exhibiting an off-capacitance;
wherein the single pole double throw switch is configured to form a π-impedance-matching network by the first inductor, the capacitor and the first field-effect transistor exhibiting the off-capacitance, or to form the π-impedance-matching network by the second inductor, the capacitor and the second field-effect transistor exhibiting the off-capacitance;
an antenna connected to the second terminal of the single pole double throw switch; and a control circuit configured to provide a first control voltage to the first control terminal and a second control voltage to the second control terminal, such that the first field-effect transistor and the second field-effect transistor are alternatively switched off to allow connection of the antenna with one of the first terminal and the third terminal, wherein:
the width of the first field-effect transistor is equal to $$\frac{2(1-E)r_{on,1}}{EZ_0},$$

the width of the second field-effect transistor is equal to $$\frac{2(1-E)r_{on,2}}{EZ_0},$$

$$E = 10^{-\left(\frac{ISO}{20}\right)},$$

ISO denotes the target isolation of the single pole double throw switch,
$Z_0$ denotes a characteristic impedance,
$r_{on,1}$ denotes an on-resistance per unit transistor width of the first field-effect transistor, and
$r_{on,2}$ denotes an on-resistance per unit transistor width of the second field-effect transistor.

9. A single pole multiple throw switch, comprising:
a plurality of single pole double throw switches, wherein each single pole double throw switch of the plurality of single pole double throw switches comprises:
a first terminal, a second terminal and a third terminal;
a first control terminal and a second control terminal;
a first field-effect transistor having a drain connected to the first terminal, a source connected to the ground, and a gate;
a first bias resistor connected between the gate of the first field-effect transistor and the first control terminal;
a first inductor connected between the first terminal and the second terminal;
a second field-effect transistor having a drain connected to the third terminal, a source connected to the ground, and a gate;
a second bias resistor connected between the gate of the second field-effect transistor and the second control terminal;
a second inductor connected between the second terminal and the third terminal; and
a capacitor having one end connected to the second terminal and another end connected to the ground;
wherein the first field-effect transistor and the second field-effect transistor have respective widths based on a target isolation of the single pole double throw switch;
wherein each of the first and the second field-effect transistors has a switched-on state exhibiting an on-resistance and a switched-off state exhibiting an off-capacitance;
wherein the single pole double throw switch is configured to form a π-impedance-matching network by the first inductor, the capacitor and the first field-effect transistor exhibiting the off-capacitance, or to form the π-impedance-matching network by the second inductor, the capacitor and the second field-effect transistor exhibiting the off-capacitance;
wherein the second terminals of the plurality of single pole double throw switches are connected to each other, wherein:
the width of the first field-effect transistor is equal to $$\frac{2(1-E)r_{on,1}}{EZ_0},$$

the width of the second field-effect transistor is equal to $$\frac{2(1-E)r_{on,2}}{EZ_0},$$

$$E = 10^{-\left(\frac{ISO}{20}\right)},$$

ISO denotes the target isolation of the single pole double throw switch,
$Z_0$ denotes a characteristic impedance,
$r_{on,1}$ denotes an on-resistance per unit transistor width of the first field-effect transistor, and
$r_{on,2}$ denotes an on-resistance per unit transistor width of the second field-effect transistor.

* * * * *